United States Patent [19]

Telser et al.

[11] Patent Number: 5,176,986

[45] Date of Patent: Jan. 5, 1993

[54] LIQUID CLEANER COMPOSITION FOR REMOVING POLYMERIC MATERIALS FROM A SURFACE

[75] Inventors: Thomas Telser, Schriesheim; Wolfgang Huemmer, Limburgerhof; Horst Koch, Gruenstadt; Karl-Rudolf Kurtz, Heidelberg; Heinz-Ulrich Werther, Wachenheim; Beinhard Schneider, Frankenthal, all of Fed. Rep. of Germany

[73] Assignee: BASF Aktiengesellschaft, Ludwigshafen, Fed. Rep. of Germany

[21] Appl. No.: 356,933

[22] Filed: May 25, 1989

[30] Foreign Application Priority Data

Mar. 17, 1989 [DE] Fed. Rep. of Germany ....... 3908764

[51] Int. Cl.$^5$ .............................. G03F 7/02
[52] U.S. Cl. .................. 430/306; 430/294; 430/300; 430/302; 430/309; 430/325; 430/326; 430/331
[58] Field of Search ............... 430/306, 309, 331, 302, 430/294, 300, 325, 326

[56] References Cited

U.S. PATENT DOCUMENTS

| | | | |
|---|---|---|---|
| 2,754,279 | 7/1956 | Hall | 430/309 |
| 2,760,863 | 12/1952 | Plambeck | 430/306 |
| 3,794,494 | 2/1974 | Kai et al. | 430/286 |
| 3,929,499 | 12/1975 | Thomas | 106/268 |
| 3,933,674 | 1/1976 | Farnsworth | 252/171 |
| 3,990,897 | 11/1976 | Zuerger et al. | 430/273 |
| 4,162,919 | 7/1979 | Richter et al. | 430/271 |
| 4,163,673 | 8/1979 | Dechert | 106/11 |
| 4,266,005 | 5/1981 | Nakamura et al. | 430/271 |
| 4,294,908 | 10/1981 | Harita et al. | 430/286 |
| 4,310,616 | 1/1982 | Hamada et al. | 430/306 |
| 4,320,188 | 3/1982 | Heinz et al. | 430/281 |
| 4,323,636 | 4/1982 | Chen | 430/271 |
| 4,323,637 | 4/1982 | Chen et al. | 430/271 |
| 4,369,246 | 1/1983 | Chen et al. | 430/306 |
| 4,438,009 | 3/1984 | Brusky et al. | 252/90 |
| 4,438,009 | 3/1984 | Brusky et al. | 252/90 |
| 4,446,044 | 5/1984 | Rutkiewie et al. | 252/170 |
| 4,704,225 | 11/1987 | Stoufer | 252/153 |
| 4,849,307 | 7/1989 | Hoffmann et al. | 430/302 |

FOREIGN PATENT DOCUMENTS

| | | |
|---|---|---|
| 80042 | 9/1981 | European Pat. Off. . |
| 0084851 | 8/1983 | European Pat. Off. . |
| 95171 | 11/1983 | European Pat. Off. . |
| 119337 | 9/1984 | European Pat. Off. . |
| 126241 | 11/1984 | European Pat. Off. . |
| 0133265 | 12/1987 | European Pat. Off. . |
| 353878 | 2/1990 | European Pat. Off. . |
| 921529 | 3/1963 | United Kingdom . |

OTHER PUBLICATIONS

Chemical Abstract, 8005j, vol. 90, No. 46, p. 8012, (1979).
Derwent Abstract 84-084544, JP-142362, Feb. 1984.
Derwent Abstract 48178B/26, JA-129912, May 1979.

Primary Examiner—Hoa Van Le
Attorney, Agent, or Firm—Keil & Weinkauf

[57] ABSTRACT

A new liquid cleaner composition is provided for the mild and gentle removal of polymeric materials from sufaces without leaving any residues. The said new cleaner composition is an emulsion of the water-in-oil type comprising an aqueous phase finely dispersed in a continuous phase selected from the group consisting of nonflammable, fire-retardant, high-boiling, and fire-retardant and high-boiling organic phases, the volume ratio of the finely dispersed aqueous phase to the continuous organic phase being in the range of from 90:10 to 10:90. The new liquid cleaner composition can contain alcohols, surface-active agents and further useful additives. The new liquid cleaner composition is most preferably used in the process for preparing photopolymerized flexographic relief printing plates as the developer for washing out the non-irradiated and thus non-photopolymerized areas of the imagewise irradiated relief-forming recording layers of the said flexographic relief printing plates.

2 Claims, No Drawings

LIQUID CLEANER COMPOSITION FOR REMOVING POLYMERIC MATERIALS FROM A SURFACE

The present invention relates to a novel liquid cleaner composition for the gentle yet residueless removal of organic materials that are soluble or swellable in organic solvents from a surface. More particularly, the present invention relates to the use of the novel liquid cleaner composition in the preparation of photopolymerized flexographic relief printing plates.

Liquid cleaner compositions by means of which surfaces can be freed in a gentle manner from resinous, rubbery or tarlike materials adhering thereto are known for example from U.S. Pat. No. 3,933,674. These known liquid cleaner compositions consist mainly of a deodorized hydrocarbon oil, an oil-like citrus distillate or extract, lanolin and a surface-active compound. Liquid cleaner compositions of this type do not attack dye or lacquer layers, nor do they cause skin irritation. However, their solvency leaves something to be desired in many applications, so that the residueless cleaning, in particular of structured surfaces, either is not possible or requires an excessively long time and excessively large amounts of the liquid cleaner composition.

The art further knows liquid cleaner compositions which are emulsions of the oil-in-water type and are used for the cleaning of, or the washing away of polymeric materials from, oxide surfaces. See for example DE-A-1,166,002 (corresponding to GB 921,529). The emulsion described therein contains as the dispersed phase a water-insoluble organic solvent which is present finely divided in the continuous aqueous phase. This oil-in-water emulsion contains as the water-insoluble organic solvent for example xylene, amyl acetate and/or tetrachloroethylene, but it may also contain additives such as aliphatic alcohols. This known oil-in-water emulsion is used in particular in the developing of light-sensitive lithographic printing plates following imagewise exposure. In this known form of development, the areas of the light-sensitive recording layer of the lithographic printing plate which are still soluble following imagewise exposure are washed off the lithographic printing plate, thereby completely baring the hydrophilic oxide surface of the printing plate substrate in these areas.

To develop such lithographic printing plates or photoresists where hydrophilic oxide surfaces are to be bared, it is essential that the emulsions used for this purpose are of the oil-in-water type to ensure wetting of the hydrophilic surface areas in question. Furthermore, the solvency of the emulsions in question need not be especially high because the recording layers of the lithographic printing plates and photoresists to be developed following imagewise exposure are in general only from 0.1 to 10 μm in thickness, so that only small amounts of polymeric material need to be washed off. The known oil-in-water emulsions are therefore not unconditionally usable for other purposes. More particularly, they are not suitable for the gentle yet residueless cleaning of a structured surface from large amounts polymeric materials, in particular elastomers, adhering to said surface.

The selection of liquid cleaner compositions or developer solutions is particularly critical in the preparation of photopolymerized relief printing plates, in particular flexographic relief printing plates.

It is known that in the preparation of such a flexographic relief printing plate the photopolymerizable relief-forming recording layer thereof, which is soluble or swellable in organic solvents, is subjected to imagewise exposure, and the unexposed and therefore non-photopolymerized areas of the relief-forming recording layer which has been subjected to imagewise exposure are washed away or developed with a developer solution. This requires on the one hand the removal of major amounts of polymeric material from the surface of the photopolymerized relief layer remaining behind without leaving behind any residues, and on the other that the photopolymerized relief layer is not harmed in the course of this washout since otherwise the quality of its printing surface is impaired.

In the past, photopolymerized flexographic relief printing plates have been prepared in the described manner using chlorinated hydrocarbons such as tetrachloroethylene, aromatic hydrocarbons such as xylene or toluene, saturated cyclic and acyclic hydrocarbons such as octane or cyclohexane, unsaturated cyclic hydrocarbons such as limonene, petroleum distillates, hydrogenated petroleum fractions, alcohols such as n-butanol, ketones such as methyl ethyl ketone, esters such as ethyl acetate, ethers such as dioxan or tetrahydrofuran or aqueous solvents such as water or sodium hydroxide solution. The choice of which developer solution was used depended primarily on the solubility characteristics of the polymeric, in particular elastomeric, material to be washed off, as is clear from U.S. Pat. No. 2,760,863, U.S. Pat. No. 3,794,494 and U.S. Pat. No. 4,294,908. Yet it is also pointed out in U.S. Pat. No. 2,760,863 that there are still other selection criteria which play a crucial role. For instance, a good developer solution should not attack the photopolymerized relief layer remaining on the flexographic relief printing plate and yet still show high solvency. It should have a high rate of evaporation to ensure rapid drying of the photopolymerized relief layer, although a high evaporation rate can prove disadvantageous if the developer solution is toxic and/or easily flammable. Accordingly, the developer solution should have a high flashpoint or, ideally, not be flammable at all, which in turn is only possible if toxic and/or high-boiling developer solutions are used, which, however, are difficult or impossible to handle, reuse and dispose of under practical operating conditions.

The essential disadvantage of prior art liquid cleaner compositions which are used very generally for cleaning a surface from polymeric materials adhering thereto is in relation to the aforementioned use in particular that the known liquid cleaner compositions either do not ensure a residueless washout from the surface of the photopolymerized relief layer of the polymeric materials which are soluble in organic solvents, or are overaggressive and therefore attach the printing surface of the photopolymerized relief layer or the relief layer as a whole.

The disadvantages of previosly disclosed liquid cleaner compositions are particularly serious, especially in relation to this specific use because here the disadvantages are literally plain to see. More specifically, the liquid cleaner compositions or developer solutions hitherto used in the preparation of photopolymerized flexographic relief printing plates entail the formation of elastomer residues in the form of runny noses and of wrinkles and vermiform structures, the orange peal effect, on or in the printing surface of the photopolymerized relief layer.

It is an object of the present invention to provide a novel liquid cleaner composition which finds utility in the removal of polymeric materials which are soluble or swellable in organic solvents from a surface and which no longer have the disadvantages of the prior art. The novel liquid cleaner composition should provide mild and gentle cleaning of the surface in question without leaving any residues behind. More particularly, the novel liquid cleaner composition, if used as a developer solution in the preparation of photopolymerized flexographic relief printing plates, should no longer have the above-described disadvantages but give photopolymerized flexographic relief printing plates whose photopolymerized relief layer has a flawless printing surface.

We have found, surprisingly, that this object is achieved by adding large amounts of water to organic solvents. Given the fact that, having regard to the prior art, it was common knowledge that polymeric materials which are soluble in organic solvents should be dissolved or swelled by using precisely these organic solvents and not aqueous solvents, the found achievement is all the more surprising.

The present invention accordingly provides a liquid cleaner composition for mildly and gently removing polymeric materials which are soluble or swellable in organic solvents, from a surface without leaving any residues, the liquid cleaner composition being an emulsion of the water-in-oil type comprising an aqueous phase finely dispersed in a continuous phase selected from the group consisting of nonflammable or fire-retardant and/or high-boiling organic phases, the volume ratio of the finely dispersed aqueous phase to the said continuous organic phase being in the range of from 90:10 to 10:90.

The liquid cleaner composition according to the invention is a water-in-oil emulsion; that is, it consists of a finely dispersed aqueous phase and a continuous organic phase. According to the invention, the volume ratio of the aqueous phase to the organic phase is within the range from 90:10 to 10:90. It is perfectly possible to use a larger volume ratio, for example 95:5, or a smaller volume ratio, for example 5:95. However, liquid cleaner compositions according to the invention which have such volume ratios either are suitable only for very specific uses or do not always have the particular advantages of the liquid cleaner composition according to the invention to a reliable extent. Accordingly, the volume ratio of from 90:10 to 10:90 is the optimum range within which the volume ratio of aqueous phase to organic phase can be advantageously set in a controlled manner and be adapted to the particular intended use.

Within the optimum range, the range of from 70:30 to 30:70 is particularly advantageous because the liquid cleaner composition according to the invention which have a volume ratio within this range have a particularly good yet gentle cleaning action.

Very particular preference is given to using the liquid cleaner compositions according to the invention which have a volume ratio within the range from 60:40 to 40:60. This is because these liquid cleaner compositions according to the invention can be used particularly outstandingly for the gentle yet residueless cleaning of all kinds of surfaces. More particularly, they are highly suitable for use as developer solutions in the preparation of photopolymerized flexographic relief printing plates.

One of the essential constituents of the liquid cleaner composition or water-in-oil emulsion according to the invention is the finely dispersed aqueous phase which contains distilled or demineralized water or normal tap water of potable quality. Preferably, the water is normal tap water.

This aqueous phase may contain suitable dissolved additives.

Examples of suitable additives are water-soluble organic and inorganic acids or bases, organic and inorganic acidic and basic salts, complexing agents and odor-improving substances. These additives are used in such amounts that they do not impair the formation and the stability of the water-in-oil emulsion according to the invention.

The other essential constituent of the liquid cleaner composition or water-in-oil emulsion according to the invention is the continuous organic phase which as such is nonflammable or fire-retardant and/or high-boiling. The term nonflammable here denotes that the organic phase in question does not of itself maintain combustion under the oxygen partial pressure of air. The term fire-retardant here denotes that the organic phase as such has a flashpoint as defined in German Standard Specification DIN 51 755 or DIN 51 758 of above 45° C., preferably 50° C. or in particular 60° C. The term high-boiling here denotes that the organic phase in question has a boiling point or boiling range above 120° C., preferably 150° C. or in particular 160° C.

Suitable organic phases consist in the main of chlorinated hydrocarbons, saturated and/or unsaturated cyclic hydrocarbons, saturated and/or unsaturated acyclic hydrocarbons, petroleum distillates, hydrogenated petroleum fractions and/or mixtures thereof, which are all by themselves already nonflammable or fire-retardant and/or high-boiling.

Examples of suitable chlorinated hydrocarbons to be used according to the invention are 1,1,1-trichloroethane and tetrachloroethylene, of which tetrachloroethylene is preferred.

Examples of suitable aromatic hydrocarbons to be used according to the invention are xylene, the trimethyl-substituted benzenes, ethylbenzene, the diethyl-substituted benzenes, cumene, n-butylbenzene, tetrahydronaphthalene, n-pentylbenzene and n-hexylbenzene.

Examples of suitable saturated cyclic hydrocarbons to be used according to the invention are cyclooctane, decalin, hexylcyclopentane and hexylcyclohexane.

Examples of suitable unsaturated cyclic hydrocarbons to be used according to the invention are monoterpenes such as p-methane, borneol, menthone, D- and L-limonene, $\alpha$-terpineol, $\alpha$-terpinene, $\gamma$-terpinene, terpinolene, $\alpha$-, $\beta$- and $\delta$-pinene and citronellol.

Examples of suitable saturated acyclic hydrocarbons to be used according to the invention are octane, nonane, decane, undecane, dodecane, tridecane and tetradecane.

Examples of suitable unsaturated acyclic hydrocarbons to be used according to the invention are octene, nonene, decene and undecene.

Examples of suitable petroleum distillates and hydrogenated petroleum fractions to be used according to the invention are those which have a boiling range from 150° to 190° C., a flashpoint of from 40° to 50° C., an aromatics content of 25%, a naphthenic hydrocarbon content of 10% and a paraffin content of 65%; those which have a boiling range from 180° to 220° C., a flashpoint of from 60 to 70° C., an aromatics content of 25%, a naphthenic hydrocarbon content of 10% and a paraffin content of 65%; those dearomatized ones which have a boiling range from 180° to 220° C., a flashpoint of above 60° C., an aromatics content of less than 1%, a naphthenic hydrocarbon content of 35% and a paraffin content of greater than 64%; synthetic isoparaffins which have a boiling range from 180° to 220° C., a flashpoint of above 65° C. and a paraffin content of greater than 99%; those which have a boiling range from 170° to 260° C., a flashpoint of above 60° C., an aromatics content of 13%, a naphthenic hydrocarbon content of 10% and a paraffin content of 77%; n-paraffin fractions which have a boiling range from 180° to 230° C., a flashpoint of above 55° C., an aromatics content of less than 0.1% and a paraffin content of greater than 99.9%; and hydrogenated mineral oils having a boiling range from 220° to 260° C., a flashpoint of 90° C. or higher, an aromatics content of 3%, a naphthenic hydrocarbon content of 31% and a paraffin content of 66%.

Examples of further suitable organic solvents to be used according to the invention as organic phases of the liquid cleaner composition according to the invention are fire-retardant and/or high-boiling ethers, esters and ketones, such as dibutyl ether, dipentyl ether, dihexyl ether, hexyl acetate, heptyl acetate, octyl acetate, nonyl acetate, decyl acetate, dibutyl adipate, diethyl sebacate, dibutyl sebacate, diethyl phthalate, dibutyl phthalate, diethyl succinate and mixtures of long-chain alkyl esters having alkyl groups of different chain lengths, and also ethyl butyl ketone and dibutyl ketone.

Of the abovementioned examples of suitable organic phases to be used according to the invention, tetrachloroethylene, the dearomatized petroleum fractions, the synthetic isoparaffins, the n-paraffin fractions, the hydrogenated mineral oils, the cyclic monoterpenes and the long-chain alkyl esters having alkyl groups of different chain lengths are particularly advantageous.

In addition, the organic phase to be used according to the invention may contain suitable odor-improving substances in solution in such an amount that the formation and the stability of the water-in-oil emulsion according to the invention are not impaired.

The liquid cleaner composition according to the invention may also contain, in addition to the two essential constituents, from 0.1 to 20% by volume of at least one alcohol.

Examples of suitable alcohols are n-butanol, n-pentanol, n-hexanol, cyclohexanol, n-heptanol, n-octanol, n-decanol, lauryl alcohol, 3-methyl-3-methoxybutanol, benzyl alcohol and 2,3,5-trimethylhexanol.

In addition, the liquid cleaner composition according to the invention can contain from 0.001 to 10% by volume, preferably from 0.01 to 5% by volume, in particular from 0.1 to 2% by volume, of at least one surface-active compound.

Examples of suitable surface-active substances are emulsifiers of the type customarily used for stabilizing water-in-oil emulsions, such as condensation products of fatty amines with ethylene oxide, condensation products of alcohols with long-chain fatty acids and condensation products of amino alcohols with long-chain fatty acids. Examples of particularly highly suitable emulsifiers are Cremophor ® WOCE 5115 from BASF (adduct of glycerol, epichlorohydrin, oleyl alcohol and ethylene oxide), Span ® 60 from ICI (sorbitan monostearate) and Emulan ® FN from BASF (adduct of an amino alcohol and oleic acid).

The method of preparing the liquid cleaner composition according to the invention has no special features, but simply takes the form of adding together the desired constituents in the desired amounts with intensive mixing by stirring, spraying or recirculating. It is of advantage here to store the constituents in question together in a stock vessel and to prepare the liquid cleaner composition according to the invention therefrom immediately before use.

The liquid cleaner composition according to the invention has particular unexpected advantages.

For instance, it is either substantially or completely odorless, or has, compared with the pure organic phase, distinctly less of an odor or an appreciably more pleasant odor. If no nonflammable organic phase such as tetrachloroethylene is used, its flashpoint is distinctly increased, compared with the pure already fire-retardant organic phase, which is why its application does not require any explosion-protected installations. If a comparatively toxic organic phase is used in the liquid cleaner composition according to the invention, the emission of the organic phase can be suppressed with a lower level of technical resources than is the case with the pure organic phase, so that the maximum emission values for the particular pure organic phase prescribed by the law can be significantly undercut, which is why the use of the particular liquid cleaner composition according to the invention is also of advantage for safety, ecological and health reasons. For this reason it is also possible to use the particular liquid cleaner compositions according to the invention at distinctly higher temperatures, which further increases their already high solvency.

Furthermore, the liquid cleaner composition according to the invention is an excellent cleaning agent which frees all kinds of surfaces from adhering polymeric materials which are soluble or swellable in organic solvents without leaving any residues or damaging the surfaces. Accordingly, ceramic, glass, metal and plastic surfaces, even if they are structured, are excellently cleanable by means of the liquid cleaner composition according to the invention. Plastic surfaces in particular of the type which occurs for example in photopolymerized relief layers of flexographic relief printing plates are rapidly, gently and residuelessly freeable from adhering elastomeric materials.

Moreover, the used liquid cleaner composition according to the invention, even if it contains a particularly high-boiling organic phase, can be purified in a simple manner by distillation under atmospheric pressure and then be reused.

All these and further particular unexpected advantages of the liquid cleaner composition according to the invention are particularly apparent if used as a developer solution in the preparation of photopolymerized flexographic relief printing plates.

A is common knowledge, a photopolymerized flexographic relief printing plate is prepared from a light-sensitive recording element comprising a dimensionally stable base and a photopolymerizable relief-forming recording layer. The photopolymerizable relief-forming recording layer itself customarily contains, as a binder, at least one elastomer which is soluble or swellable in organic solvents, at least one olefinically unsaturated photopolymerizable monomer which is compatible with the elastomer(s), and at least one photopolymerization initiator. If the photopolymerized flexographic relief printing plate to be prepared from the light-sensitive recording element is to be used for high-quality halftone flexographic printing, the photopolymerizable relief-forming recording layer is in general up to 0.7 mm in thickness. If, by contrast, the photopolymerized flexographic relief printing plate in question is to be used in cardboard and corrugated board printing, the thickness of the photopolymerizable relief-forming recording layer is up to 7 mm. In general, the binders used are elastomers such as aromatic vinyl/alkadiene block copolymers (styrene-isoprene-styrene, styrene-butadiene-styrene, styrene-isoprene-st-yrene/butadiene, etc.), alkadiene/acrylonitrile copolymers (butadiene-acrylonitrile), fluororubbers (vinylidene chloride/hexafluoropropylene copolymers), natural rubber, silicone polymers and polysulfide rubbers.

Examples of suitable light-sensitive recording elements for the preparation of photopolymerized flexographic relief printing plates are known from EP-B-0,084,851, U.S. Pat. No. 4,323,636, U.S. Pat. No. 4,369,246, U.S. Pat. No. 4,323,637, EP-B-0,133,265, U.S. Pat. No. 4,162,919, U.S. Pat. No. 4,320,188 (DE-A-2,942,183), EP-B-0,027,612 and DE-A-2,939,989.

The photopolymerizable relief-forming recording layer of the light-sensitive recording elements is, as is common knowledge, subjected to an imagewise exposure with actinic light, as a result of which its exposed areas undergo crosslinking by photopolymerization and therefore become insoluble, whereas its unexposed and therefore non-photopolymerized areas remain soluble in organic solvents. These areas of the relief-forming recording layer which has been subjected to imagewise exposure can therefore be washed out with a developer solution, leaving the photopolymerized relief layer of the flexographic relief printing plate. Because in this step large amounts of elastomeric material must be washed out rapidly, gently and without leaving a residue, the washout or development of the relief-forming recording layer after imagewise exposure is particularly critical.

Customarily, developing is carried out in the known spray or brush washers at from 20° to 50° C. We have found here that the washout time required for a certain washout depth is either not at all or only insignificantly higher with the liquid cleaner composition according to the invention despite its high water content than with the pure organic phase, but that the amount of solvent taken up by the photopolymerized relief layer remaining behind is in many cases reduced. This very appreciably improves the over-washing resistance of the photopolymerized relief layer, so that even if the washout time required for a certain relief height is exceeded, defect-free relief structures are obtained. This is especially important for photopolymerized flexographic relief printing plates which are to be used for high-quality halftone flexographic printing.

Similarly, the breakout stability of the relief structures is appreciably improved by using the liquid cleaner composition according to the invention. This is especially important in the case of a thick non-rigid flexographic high-relief printing plate used for example in cardboard and corrugated board printing.

A further surprising advantage resulting from the use of the liquid cleaner composition according to the invention as a developer solution concerns the printing surface of the photopolymerized relief layer of the flexographic relief printing plate. This printing surface is of immaculate appearance and has no undesirable surface structures in the form of wrinkles or worms (orange peel effect), but is uniformly smooth or matt. Nor do any residues of elastomeric material remain behind on the printing surface in the form of runny noses, which is a significant advantage in respect of quality of the printed copies produced with the flexographic relief printing plate in question.

A further surprising advantage is the fact that the use of the liquid cleaner composition according to the invention as a developer solution does not entail extended drying times after development.

A further advantage is that developing by means of the liquid cleaner composition according to the invention can be carried out in washers which are not explosion-protected. In addition, aspiration of the washers can be much reduced owing to the low self-odor and/or the distinctly reduced toxicity of the liquid cleaner composition according to the invention.

EXAMPLES AND COMPARISONS

The examples and comparisons were carried out using the following flexographic relief printing plates:

Flexographic Relief Printing Plate 1

Flexographic relief printing plate 1 had a 125 μm thick polyethylene terephthalate film coated with a polyurethane adhesive as a dimensionally stable base. Its photopolymerizable relief-forming recording layer was 2,700 μm thick and consisted of 87.592% by weight of the styrene/isoprene/(styrenebutadiene) three-block copolymer described in EP-A-0,027,612,
5% by weight of a paraffin oil,
5% by weight of hexane-1,6-diol diacrylate,
1.2% by weight of benzil dimethyl acetal,
1.2% by weight of 2,6-di-tert-butyl-p-cresol and
0.008% by weight of the dye Solvent Black (C.I. 26 150).

This photopolymerizable relief-forming recording layer (B) was covered with a 5 μm thick sheet of polyamide (Macromelt ® 6900 from Henkel AG).

Flexographic Relief Printing Plate 2:

Flexographic relief printing plate 2 had the multilayer structure described in U.S. Pat. No. 3,990,897 (DE-A-2,444,118). This multilayer structure included a 2,000 μm thick resilient and flexible bottom layer prepared by uniform exposure of a photopolymerizable layer of the same composition as the photopolymerizable relief-forming recording layer described hereinafter. This resilient and flexible bottom layer had been firmly bonded to a 125 μm thick polyethylene terephthalate film as an intermediate layer. The two layers together formed the dimensionally stable base of the flexographic relief printing plate. On its open side the intermediate layer had been covered with a 700 μm thick photopolymerizable relief-forming recording layer. The recording layer consisted of
3.596% by weight of the three-block copolymer of flexographic relief printing plate 1,
5% by weight of hexane-1,6-diol diacrylate,
0.4% by weight of benzil dimethyl acetal,
1.0% by weight of 2,6-di-tert-butyl-p-cresol and
0.004% by weight of the dye Solvent Black (C.I. 26 150).

This photopolymerizable relief-forming recording layer had been covered with the top layer described in connection with flexographic relief printing plate 1.

Flexographic Relief Printing Plate 3

Flexographic relief printing plate 3 was both structurally and materially identical to the flexographic relief printing plate of Example 1 of EP-B-0,084,851.

Flexographic relief printing plates 1 and 3 were uniformly irradiated from the back with actinic light in a tubular exposure unit. Flexographic relief printing plates 1, 2 and 3 were then subjected to imagewise exposure with actinic light through a standard negative placed on their top layers for 10 minutes.

Following imagewise exposure, flexographic relief printing plates 1, 2 and 3 were, unless otherwise stated, washed out, ie. developed, at room temperature in drum brush washers of about 60 l capacity not only with liquid cleaner compositions according to the invention but also with liquid cleaner compositions not according to the invention. In the course of this development step, the unexposed areas and therefore still organically soluble or swellable areas of the relief-forming recording layers subjected to imagewise exposure were washed away, leaving behind photopolymerized relief layers, i.e., finely structured plastics surfaces.

Thereafter any traces of water remaining on the surface of photopolymerized flexographic relief printing plates 1, 2 and 3 were washed away by means of organic solvents. Photopolymerized flexographic relief printing plates 1, 2 and 3 were then dried in a through-circulation drying cabinet at 65° C. for 2 hours and, following a resting period of about 12 hours, subjected to a customary and known aftertreatment with an aqueous bromine solution to detackify their printing surface, and then exposed once more to actinic light for 10 minutes.

In this manner, a sufficient number of each photopolymerized flexographic relief printing plate 1, 2 or 3 were prepared so that the solids content of the particular novel and non-novel liquid cleaner composition (developer solutions) used in the drum brush washers reached 5% by weight, based on the liquid cleaner composition. Prior to each individual separate developing step, the particular novel or non-novel liquid cleaner composition used was recirculated in the drum brush washers for 1 minute.

During development, the emission in kg/h of the novel and non-novel liquid cleaner compositions from the drum brush washers was determined. To this end, the concentration was measured in the exhaust air from the drum brush washers in a conventional manner and multiplied by the amount of air aspirated per hour.

The novel and non-novel liquid cleaner compositions used were, as far as possible, worked up by distillation under atmospheric pressure and reused, if necessary after replenishment of the organic phase.

The surface quality of the photopolymerized flexographic relief printing plates 1, 2 and 3 prepared by the above-described general method was determined visually.

For printing trials, the photopolymerized flexographic relief printing plates 1, 2 and 3 were clamped onto printing cylinders and used in a flexographic press for continuous flexographic printing using customary and known flexographic printing inks.

EXAMPLE 1

Use of a liquid cleaner composition according to the invention for the preparation of photopolymerized flexographic relief printing plates 1.

To prepare photopolymerized flexographic relief printing plates 1, a liquid cleaner composition according to the invention comprising 24 l of the dearomatized petroleum fraction EXXSOL ® D 60 from Esso (boiling range 186 to 217° C., flashpoint according to German Standard Specification DIN 51 755 61° C., odorless, aromatics content <1%, naphthenic hydrocarbon content 35%, paraffin content >64%), 6 l of n-butanol and 30 l of tap water was used. This two-phase mixture was recirculated in the drum brush washer for 1 minute to form the water-in-oil emulsion to be used according to the invention. Since the German Standard Specification DIN 51 755 flashpoint of the liquid cleaner composition according to the invention was 39° C., no special explosion protection equipment was required for the drum brush washer used. The development or washout time for each photopolymerized flexographic relief printing plate 1 was 10 minutes.

Following development, each photopolymerized flexographic relief printing plate 1 was rinsed with the pure dearomatized petroleum fraction to remove water droplets.

The photopolymerized flexographic relief printing plates 1 prepared in this manner had excellently developed photopolymerized relief layers 1,000 μm in height. In the solid areas of the photopolymerized relief layers, neither polymer residues in the form of runny noses nor the typical orange peel effect were found. The photopolymerized relief layers were defect-free and odorless. On printing the photopolymerized flexographic relief printing plates 1 prepared in this manner gave a very long run of excellent printed copies.

The novel liquid cleaner composition used also had advantages in respect of emission and recovery.

For instance, the emission was only 0.3 kg/h. During development, the otherwise strong odor of n-butanol was much reduced. The novel liquid cleaner composition used with a solids content of 5% by weight was recoverable by distillation under atmospheric pressure at gas phase temperatures of from 90 to 110° C. In all, 54 l of the liquid cleaner composition according to the invention were recovered. After the remaining 6 l of dearomatized petroleum fraction had been replaced, the liquid cleaner composition according to the invention was ready for reuse.

COMPARISON 1

The use of a liquid cleaner composition not according to the invention for preparing photopolymerized flexographic relief printing plates 1.

Example 1 was repeated, except that the liquid cleaner composition according to the invention was replaced by the liquid cleaner composition not according to the invention, consisting of 40 l of tetrachloroethylene and 10 l of n-butanol. During development, the unpleasant sweetish odor of tetrachloroethylene and the vinous odor of n-butanol were both very strong. In addition, the emission of tetrachloroethylene was very high, so that the generally valid emission limits were exceeded by an order of magnitude. The photopolymerized flexographic relief printing plates 1 prepared in this manner had photopolymerized relief layers 1,200 μm in height. It is true that the solid areas were free of polymer residues in the form of runny noses, but vermiform structures and wrinkles (orange peel effect) were present.

COMPARISON 2

Use of a liquid cleaner composition not according to the invention for the preparation of photopolymerized flexographic relief printing plates 1.

Example 1 was repeated with the liquid cleaner composition not according to the invention which consisted of 40 l of the dearomatized petroleum fraction of Example 1 and 10 l of n-butanol. The German Standard Specification DIN 51 755 flashpoint of this liquid cleaner composition not according to the invention was 33° C., which in itself necessitated the use of explosion protection for the drum brush washer. During development there was a very strong odor of n-butanol.

Photopolymerized flexographic relief printing plates 1 were obtained whose photopolymerized relief layers had a relief height of 1,000 μm. At the surface of the individual photopolymerized relief layers there were increased polymer deposits in the form of runny noses with increasing solids content of the liquid cleaner composition.

The used liquid cleaner composition not according to the invention was not recoverable by distillation under atmospheric pressure.

EXAMPLE 2

The use of a liquid cleaner composition according to the invention for the preparation of photopolymerized flexographic relief printing plates 1.

Example 1 was repeated, except that the liquid cleaner composition according to the invention had added to it 600 g of emulsifier Cremophor® WOCE 5115 from BASF (adduct of glycerol, epichlorohydrin, oleyl alcohol and ethylene oxide). A period of recirculation gave a finely dispersed water-in-oil emulsion which did not separate again into two phases until after about 20 minutes. It had the same excellent application properties as the emulsion of Example 1 and gave similar photopolymerized flexographic relief printing plates 1.

COMPARISON 3

The use of a liquid cleaner composition not according to the invention for the preparation of photopolymerized flexographic relief printing plates 1.

Example 2 was repeated, except that the emulsifier used therein was replaced by sodium dodecyl hydrogen sulfate. The result was an oil-in-water emulsion which in washout characteristics was far inferior to the emulsion of Example 2; following a ten minute washout in each case the relief height of the photopolymerized relief layers of the photopolymerized flexographic relief printing plates 1 was only just 100 μm, which was completely inadequate.

EXAMPLE 3

The use of a liquid cleaner composition according to the invention for the preparation of photopolymerized flexographic relief printing plates 1.

Example 1 was repeated, except that the liquid cleaner composition according to the invention had added to it 1 l of limonene. During the washout, the smell of the alcohol was no longer perceivable. Instead there was a pleasant orangelike odor. As for the rest, the advantages described in detail in Example 1 as resulting from the use of the liquid cleaner composition of Example 1 according to the invention were all realized again.

EXAMPLE 4

The use of a liquid cleaner composition according to the invention for the preparation of photopolymerized flexographic relief printing plates 1.

Example 3 was repeated, except that the n-butanol was replaced by n-pentanol. The German Standard Specification DIN 51 755 flashpoint of the liquid cleaner composition according to the invention was 47° C., so that no explosion protection was necessary for the drum washer. During development there was a pleasant orange-like odor. The used liquid cleaner composition according to the invention was 90% recoverable by distillation under atmospheric pressure.

The photopolymerized relief layers of the photopolymerized flexographic relief printing plates 1 thus obtained had a relief height of 900 μm and an excellent, uniformly matt printing surface free of runny noses. Printing in a flexographic press gave a long run of printed copies which in quality of reproduction were far superior to the printed copies of Comparisons 1 to 3.

EXAMPLE 5

The use of a liquid cleaner composition according to the invention for the preparation of photopolymerized flexoprinting graphic relief plates 2.

Example 4 was repeated, except that the flexographic relief printing plates 1 used therein were replaced by relief printing plates 2. In the flexographic relief printing plates 2, the maximum obtainable relief height of the photopolymerized relief layers was limited by the plate structure to 700 μm. This maximum relief height was obtained following a washout time of only 7 minutes. The photopolymerized relief layers of the photopolymerized flexographic relief printing plates 2 prepared in this manner were of excellent quality and had an excellent uniformly matt surface without runny noses or orange peel effect. Printing on a flexographic press gave a particularly long run of excellent copies.

EXAMPLE 6

The use of a liquid cleaner composition according to the invention for the preparation of photopolymerized flexographic relief printing plates 3.

Example 1 was repeated, except that the flexographic relief printing plate 1 used therein and the novel liquid cleaner composition used therein were replaced by flexographic relief printing plate 3 and the novel liquid cleaner composition consisting of 34 l of tetrachloroethylene, 6 l of n-butanol and 20 l of water. The maximum relief height was obtained after only 7 minutes. During washing out, the unpleasantly sweetish odor of tetrachloroethylene and the vinous odor of n-butanol were much less of a nuisance than in Comparison 1. Similarly, the emission of tetrachloroethylene was distinctly lower than in Comparison 1 and was below the generally valid strict emission limits for tetrachloroethylene.

The results obtained were photopolymerized flexographic relief printing plates 3 whose photopolymerized relief layers had a uniformly matt surface without runny noses or orange peel effect. The photopolymerized flexographic relief printing plates 3 were highly suitable for continuous flexographic printing.

COMPARISON 4

The use of a liquid cleaner composition not according to the invention for the preparation of photopolymerized flexographic relief printing plates 2.

Comparison 1 was repeated, except that the flexographic relief printing plates 1 used therein were replaced by relief printing plates 2. This comparison likewise revealed the disadvantages associated with the use of the liquid cleaner composition not according to the invention which were described in Comparison 1.

It is true that the maximum relief height of the photopolymerized relief layers was obtainable in a washout time of only 7 minutes, but the surface of the photopolymerized relief layers had vermiform structures and wrinkles (orange peel effect).

EXAMPLE 7

The use of a liquid cleaner composition according to the invention for the preparation of photopolymerized flexographic relief printing plates 3.

Example 1 was repeated with flexographic relief printing plates 3. Again the advantages associated with the use of the liquid cleaner composition according to the invention which were described in detail in Example 1 were manifest, the photopolymerized flexographic relief printing plates 3 obtained having photopolymerized relief layers with an excellent uniformly matt printing surface without runny noses or orange peel effect. On printing in a flexographic press the photopolymerized flexographic relief printing plates 3 thus obtained gave a particularly long run of excellent copies.

We claim:

1. A process for preparing a flexographic relief printing plate comprising a photopolymerized relief layer having a faultless printing surface, from a photosensitive recording element comprising a dimensionally stable base and a photopolymerizable relief-forming recording layer containing, as the binder, at least one elastomer which is soluble or swellable in organic solvents, at least one olefinically unsaturated photopolymerizable monomer which is compatible with the said elastomer, and at least one photopolymerization initiator, the said process comprising the steps of (i) irradiating the said photopolymerizable relief-forming recording layer imagewise with actinic light, thus photopolymerizing its exposed areas, and (ii) washing out the non-irradiated and thus non-photopolymerized areas of the imagewise irradiated relief-forming recording layer with a liquid cleaner composition, the said liquid cleaner composition being an emulsion of the water-in-oil type comprising an aqueous phase finely dispersed in a continuous phase selected from the group consisting of nonflammable, fire-retardant, high-boiling, and fire-retardant and high-boiling organic phases, the volume ratio of the finely dispersed aqueous phase to the continuous organic phase being in the range of from 90:10 to 10:90, thus obtaining the said photopolymerized relief layer and the used liquid cleaner composition, and (iii) washing the surface of the photopolymerized relief layer with the pure organic phase in order to remove water droplets after having carried out the process step (ii).

2. The process of claim 1, which includes the steps of (iv) collecting the said used cleaner composition, (v) distilling the used cleaner composition under atmospheric pressure, and (vi) reusing the distillate thus obtained for the purposes of the said process step (ii).

* * * * *

UNITED STATES PATENT AND TRADEMARK OFFICE
CERTIFICATE OF CORRECTION

PATENT NO. : 5,176,986

DATED : Jan. 5, 1993

INVENTOR(S) : TELSER et al.

It is certified that error appears in the above-identified patent and that said Letters Patent is hereby corrected as shown below:

On the title page, item (75) Inventors:

"Beinhard Schneider" should read --Reinhard Schneider--

Signed and Sealed this

Thirtieth Day of November, 1993

Attest:

BRUCE LEHMAN

*Attesting Officer*  *Commissioner of Patents and Trademarks*